United States Patent
Aeugle et al.

(10) Patent No.: US 6,300,198 B1
(45) Date of Patent: Oct. 9, 2001

(54) METHOD FOR PRODUCING A VERTICAL MOS-TRANSISTOR

(75) Inventors: Thomas Aeugle; Wolfgang Rösner, both of München; Dag Behammer, Ulm, all of (DE)

(73) Assignees: Siemens Aktiengesellschaft; Ruhr-Universität Bochum, both of Munich (DE)

( * ) Notice: Subject to any disclaimer, the term of this patent is extended or adjusted under 35 U.S.C. 154(b) by 0 days.

(21) Appl. No.: 09/381,218

(22) PCT Filed: Mar. 11, 1998

(86) PCT No.: PCT/EP98/01407

§ 371 Date: Sep. 16, 1999

§ 102(e) Date: Sep. 16, 1999

(87) PCT Pub. No.: WO98/42016

PCT Pub. Date: Sep. 24, 1998

(30) Foreign Application Priority Data

Mar. 19, 1997 (DE) ............................................. 197 11 482

(51) Int. Cl.[7] .................................................. H01L 21/336
(52) U.S. Cl. ........................... 438/268; 438/164; 438/156
(58) Field of Search .................................. 438/343, 268, 438/158, 151, 164, 156

(56) References Cited

U.S. PATENT DOCUMENTS 4,740,826   4/1988   Chatterjee .

5,443,992 * 8/1995 Risch et al. ............................ 437/29
5,920,088 * 7/1999 Augusto ................................ 257/192
6,153,905 * 11/2000 Davies et al. ........................ 257/320

FOREIGN PATENT DOCUMENTS 196 21 244   11/1996   (DE) .
  2 103 879    2/1983   (GB) .

OTHER PUBLICATIONS

"Roadmap for Semiconductors", Solid State Technology, vol. 3, Feb. 1995, pp. 42.

A. Hori, et al., "A 0.05 μm–CMOS with Ultra Shallow Source/Drain Junctions Fabricated by SKeV Ion Implantation and Rapid Thermal Annealing", IEDM 94 p. 485.

H. Hu, et al., "Channel and Source/Drain Engineering in High–Performance Sub–0.1μm NMOSFETs Using X–Ray Lithography", 1994 Symposium on VLSI Technology Digest of Technical Papers, p. 17

L. Risch, et al., "Vertical MOS Transistors with 70 nm Channel Length", ESSDERC 1995, p. 101.

* cited by examiner

Primary Examiner—Richard Elms
Assistant Examiner—Bradley Smith
(74) Attorney, Agent, or Firm—Schiff Hardin & Waite

(57) ABSTRACT

In order to produce a vertical MOS transistor with optimized gate overlap capacitances, a mesa structure is formed with an upper source/drain region, a channel region and a lower source/drain region. With the aid of chemical/mechanical polishing, an insulation structure is formed which essentially covers the side walls of the lower source/drain region. A gate dielectric and a gate electrode, whose height is essentially equal to the height of the channel region, are formed on the side walls of the channel region.

14 Claims, 5 Drawing Sheets

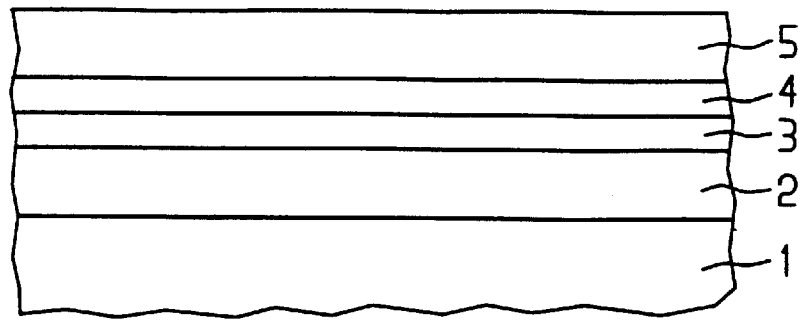
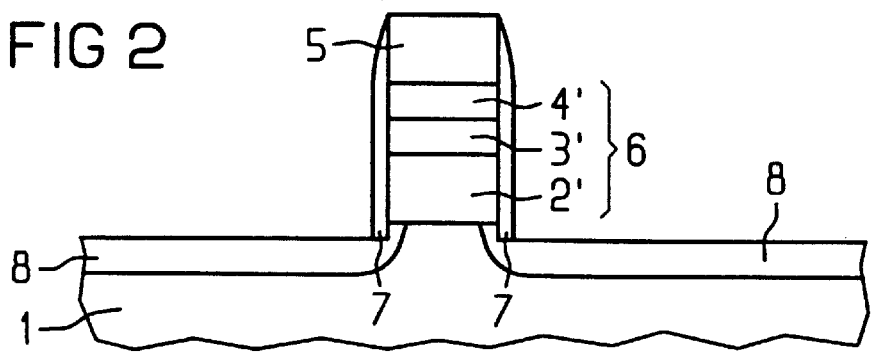
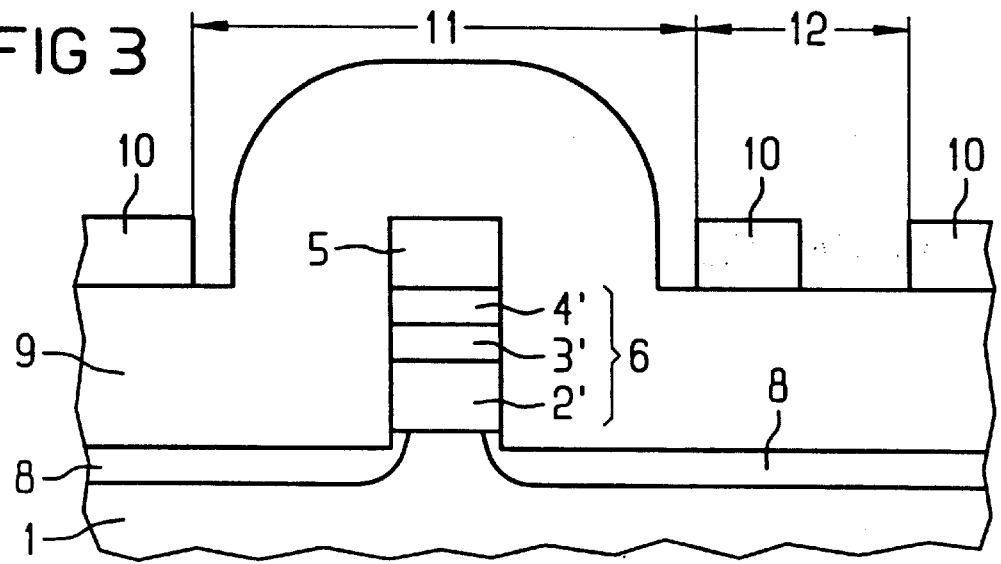

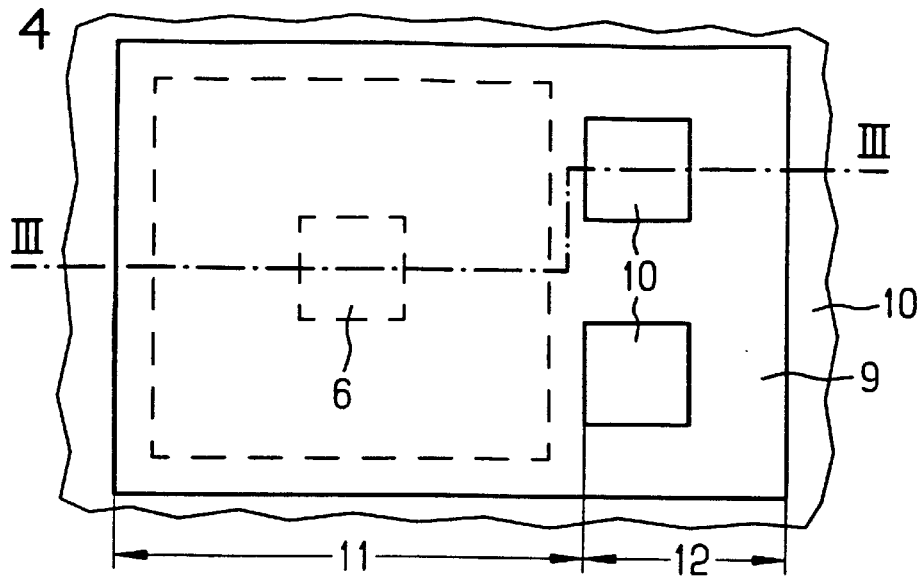
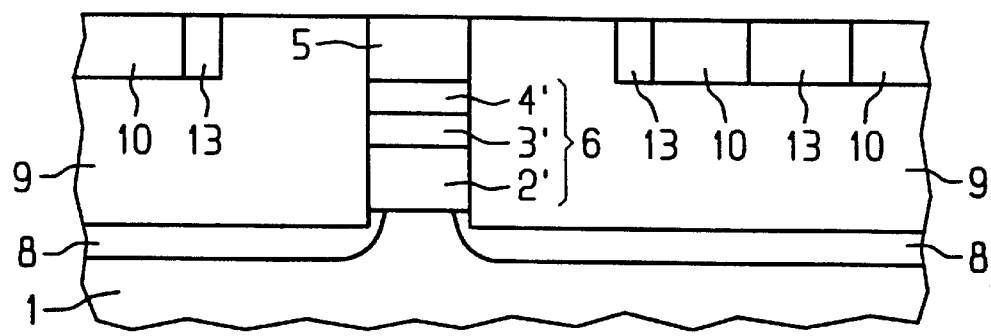
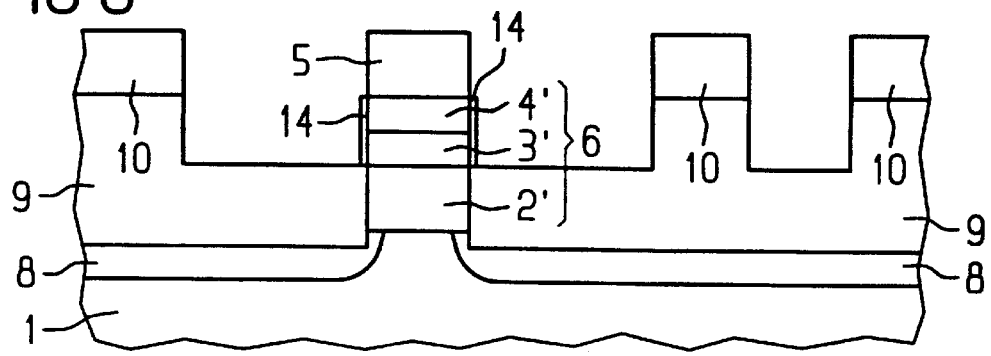

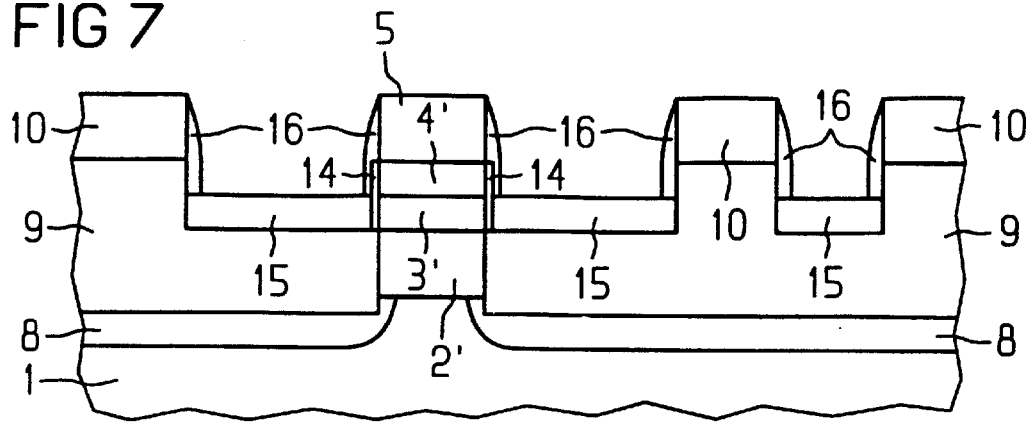
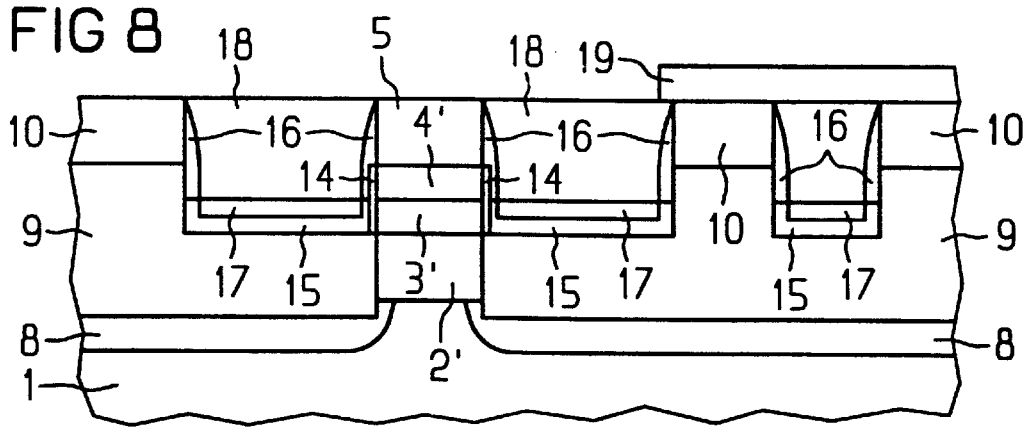
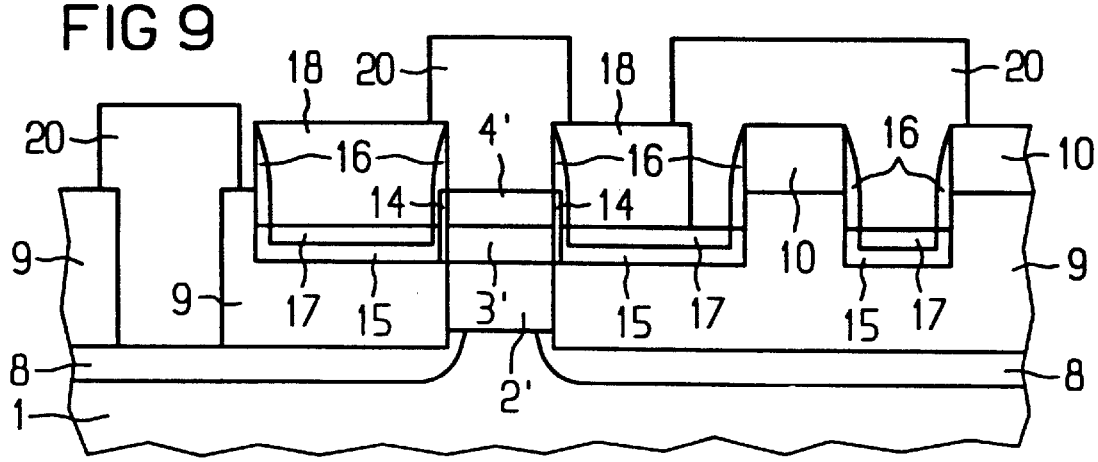

METHOD FOR PRODUCING A VERTICAL MOS-TRANSISTOR

BACKGROUND OF THE INVENTION

1. Field of the Invention

The present invention is directed to a method for the production of a vertical MOS transistor.

2. Discussion of the Related Art

With a view to ever-faster components with higher integration density, the structural sizes of integrated circuits are decreasing from generation to generation. This is also true with regard to CMOS technology. It is generally expected (see, for example, Roadmap of Semiconductor Technology, Solid State Technology 3, 1995), that MOS transistors with a gate length of less than 100 nm will be used around the year 2010.

On the one hand, attempts have been made to scale modern CMOS technology in order to produce planar MOS transistors with such gate lengths (see, for example, A. Hori, H. Nakaoka, H. Umimoto, K. Yamashita, M. Takase, N. Shimizu, B. Mizuno, S. Odanaka, A 0.05 $\mu$m-CMOS with Ultra Shallow Source/Drain Junctions Fabricated by 5 keV Ion Implantation and Rapid Thermal Annealing, IEDM 1994, 485 and H. Hu, L. T. Su, Y. Yang, D. A. Antoniadis, H I. Smith, Channel and Source/Drain Engineering in High-Performance sub-0.1 $\mu$m NMOSFETs using X-ray lithography, Symp. VLSI Technology, 17, 1994). The production of such planar MOS transistors with a channel length of less than 100 nm requires the use of electron beam lithography and has hitherto been possible only on a laboratory scale. The use of the electron beam lithography leads to a superproportional increase in development costs.

In parallel with this, vertical transistors have been investigated with a view to producing shorter channel lengths (see L. Risch, W. H. Krautschneider, F. Hofmann, H. Schäfer, Vertical MOS Transistor with 70 nm channel length, ESS-DERC 1995, pages 101 to 104). In this case, layer sequences are formed corresponding to the source, channel and drain, and are annularly surrounded by the gate dielectric and gate electrode. In terms of their radio-frequency and logic properties, these vertical MOS transistors have to date been unsatisfactory in comparison with planar MOS transistors.

German patent no. 196 21 244 has proposed a MOS transistor with reduced stray gate capacitances, which is suitable for radio-frequency applications. In order to produce this vertical transistor, a mesa structure comprising a source region, channel region and drain region in vertical succession is formed on a semiconductor substrate. The gate electrode is formed in such a way that it adjoins the mesa structure only at the channel region. Oxide structures, which embed the gate electrode, are formed below and above the gate electrode at the source and drain regions. The gate capacitances are minimized in this way. In order to produce the oxide structures and the gate electrode, corresponding layers are respectively deposited which cover the mesa. Photoresist is applied on top and planarized. The photoresist is subsequently etched back to an extent that leaves free the upper sides of the mesa. This structured photoresist is subsequently used as a mask in order to structure the underlying layer at the mesa. The thickness of the layer is in each case less than the height of the mesa. Since the planarity is limited by the flow of planarized photoresist, the height of the etching erosion in the further structuring of the photoresist layer by etching is difficult to control.

SUMMARY OF THE INVENTION

It is an object of the invention to provide a method for the production of a vertical MOS transistor with reduced gate overlap capacitances, which is essentially improved with regard to process reliability.

This object is achieved in accordance with the invention in a method for producing a vertical MOS transistor having a mesa structure, which has a lower source/drain region, a channel region and an upper source/drain region, is formed from a semiconductor layer sequence. The semiconductor layer sequence is formed by epitaxy or by implantation and annealing. A first auxiliary layer, which is structured together with the semiconductor layer sequence, is applied to the semiconductor layer sequence. A terminal region for the lower source/drain region is formed laterally with respect to the mesa structure in the semiconductor substrate. An insulation structure is formed which essentially covers at least the side wall of the lower source/drain region. A gate dielectric and a gate electrode are formed on the side of the channel region. The height of the gate electrode is essentially equal to the height of the channel region. In order to form the insulation structure, an insulating layer is applied whose thickness is greater than or equal to the thickness of the semiconductor layer sequence. The insulating layer is planarized by chemical/mechanical polishing. In this case, the first auxiliary layer, which is located as the uppermost layer on the mesa structure, is used as an etching stop.

A flat zone, in which the surface of the first auxiliary layer is exposed, is formed by the chemical/mechanical polishing. This provides a reference plane for subsequent etching steps. The depth of the etching erosion in subsequent etching steps can therefore be controlled better than in the prior art.

According to one embodiment of the invention, the insulating layer is applied with essentially conformal edge coverage. Its thickness in this case is essentially equal to the thickness of the semiconductor layer sequence. This means that, laterally with respect to the mesa structure, the surface of the insulating layer is level with the surface of the upper source/drain region of the mesa structure.

A second auxiliary layer is applied which has the same etching properties and essentially the same thickness as the first auxiliary layer. Laterally with respect to the mesa structure, the surface of the second auxiliary layer is therefore arranged level with the surface of the first auxiliary layer. The second auxiliary layer is subsequently structured in such a way that the surface of the insulating layer is exposed at least in a first area, The first area laterally overlaps the mesa structure. The lateral dimensions of the first area are respectively greater by at least twice the layer thickness of the insulating layer than corresponds to the corresponding lateral dimension of the mesa structure. The second auxiliary layer therefore covers the insulating layer in the part which is arranged outside the mesa structure and in which the elevation of the mesa structure does not have an effect on the topology of the insulating layer. In other words: during the structuring of the second auxiliary layer, that part of the second auxiliary layer is removed in which the surface of the second auxiliary layer is arranged above the surface of the first auxiliary layer. After the structuring of the second auxiliary layer, the surface of the first auxiliary layer and the surface of the second auxiliary layer are arranged everywhere at the same level.

The surface of the first auxiliary layer is subsequently exposed by chemical/mechanical polishing of the insulating layer. The first auxiliary layer and the second auxiliary layer in this case act as an etching stop.

Subsequently, using the first auxiliary layer and the second auxiliary layer as a mask, the insulating layer is etched to such an extent that the side wall of the channel region is essentially exposed. The insulating layer is not etched underneath the channel region, so that, on the side wall of the mesa structure, the insulating layer extends as far as the boundary between the lower source/drain region and the channel region.

A gate dielectric is formed on the exposed side wall of the channel region.

A conductive layer is produced which essentially fills the intermediate space between the insulating layer and the mesa structure. The intermediate space between the insulating layer and the mesa structure is produced by the etching of the insulating layer as far as the upper boundary of the lower source/drain region. The gate electrode is subsequently formed by etching back the conductive layer.

The second auxiliary layer is preferably structured in such a way that the surface of the insulating layer is additionally exposed in a second area. During the etching of the insulating layer to expose the side wall of the channel region, the insulating layer is also etched in the second area, so that a continuous opening is produced in the second area and in the first area. During the formation of the conductive layer, this opening is essentially filled. The gate electrode formed by etching back the conductive layer therefore has the cross-section of the opening. In the subsequent course of the process, a contact hole for the gate electrode is opened in the second area.

It is particularly advantageous, during the structuring of the second auxiliary layer, to provide auxiliary structures in the second area which, during the structuring of the insulating layer, make islands from the material of the insulating layer in the opening. In the second area, the opening and therefore the gate electrode has a grid-shaped cross-section. A thickness of the conductive layer corresponding to the dimensions of the opening is then sufficient for filling the opening with the conductive layer. Furthermore, the grid-shaped cross-section of the gate electrode in the second area has the advantage that alignment is not critical when opening the contact hole to the gate electrode. The islands are preferably arranged in such a way that the distance between islands which lie opposite one another in the second area is not greater than the distance between the side wall of the mesa structure and the opposite side wall of the insulating structure in the first area. This reduces the required thickness of the conductive layer.

It is within the scope of the invention to apply a third auxiliary layer before removing the first auxiliary layer and the second auxiliary layer. The first auxiliary layer and the second auxiliary layer can be etched selectively with respect to the third auxiliary layer. The third auxiliary layer is structured in such a way that the first auxiliary layer is exposed and the second area is covered by the third auxiliary layer. The effect achieved by this is that the first auxiliary layer, which is arranged on the surface of the mesa structure, can be removed while the second auxiliary layer remains in the second area on the surface of the silicon islands. The effect of this is that, during fabrication of the structure, contact holes to the terminal regions of the lower source/drain region and contact holes to the gate electrode can be etched separately. This avoids etching through the insulating layer at the islands in the second area, which can lead to short-circuits between the semiconductor substrate and the gate electrode.

It is within the scope of the invention for the first auxiliary layer and the second auxiliary layer to contain $Si_3N_4$ and for the third auxiliary layer, if present, to contain polysilicon. The insulating layer and the insulating filling contain $SiO_2$.

The conductive layer contains doped polysilicon, metal silicide, metal and/or a combination of these materials. Suitable materials for the conductive layer are, however, ones which are appropriate for gate electrodes.

In another embodiment of the invention, the insulating layer is eroded by chemical/mechanical polishing as far as the level of the first auxiliary layer. It is subsequently structured by etching it back, with the insulation structure which is arranged laterally with respect to the mesa structure and whose thickness is essentially equal to the height of the lower source/drain region being formed. The side wall of the channel region is in this case likewise exposed. A gate dielectric is formed on the side wall of the channel region. A conductive layer is deposited and structured in order to form the gate electrode. In this case, parts of the conductive layer which are arranged on the side walls of the mesa above the channel region, or on the surface of the mesa, are removed. A further insulating layer is applied which covers the gate electrode.

It is within the scope of the invention for the insulating layer, the further insulating layer and/or the insulating filling to contain $SiO_2$, and for the first auxiliary layer to contain silicon nitride. All materials which are customary as a gate electrode material are suitable for the conductive layer, in particular doped polysilicon, metal silicide, metal and/or a combination of these materials.

These and other objects of the invention will become clearer with reference to the following detailed description of the preferred embodiments and accompanying drawings.

BRIEF DESCRIPTION OF THE DRAWINGS

FIG. 1 is a side view of a semiconductor substrate with a semiconductor layer sequence and a first auxiliary layer;

FIG. 2 is a cross-section through the semiconductor substrate after the formation of a mesa structure by structuring the semiconductor layer sequence, after the formation of spacers on the side walls of the mesa structure, and after the formation of a terminal region;

FIG. 3 is a cross-section through the semiconductor substrate after the application of an insulating layer and after the application and structuring of a second auxiliary layer;

FIG. 4 is a plan view of FIG. 3;

FIG. 5 is a cross-section through the semiconductor substrate after the insulating layer has been planarized;

FIG. 6 is a cross-section through the semiconductor substrate after partial exposure of the side wall of the mesa structure and the formation of a gate dielectric on the exposed side wall of the mesa structure;

FIG. 7 is a cross-section through the semiconductor substrate after the formation of a gate electrode;

FIG. 8 is a cross-section through the semiconductor substrate after the formation of a metal silicide layer on the surface of the gate electrode, after the formation of insulating filling which lies above the gate electrode and ends level with the first and second auxiliary layers, and after the deposition and structuring of a third auxiliary layer;

FIG. 9 is a cross-section through the semiconductor substrate after the formation of contacts;

DETAILED DESCRIPTION OF THE PREFERRED EMBODIMENTS

Figure 10:
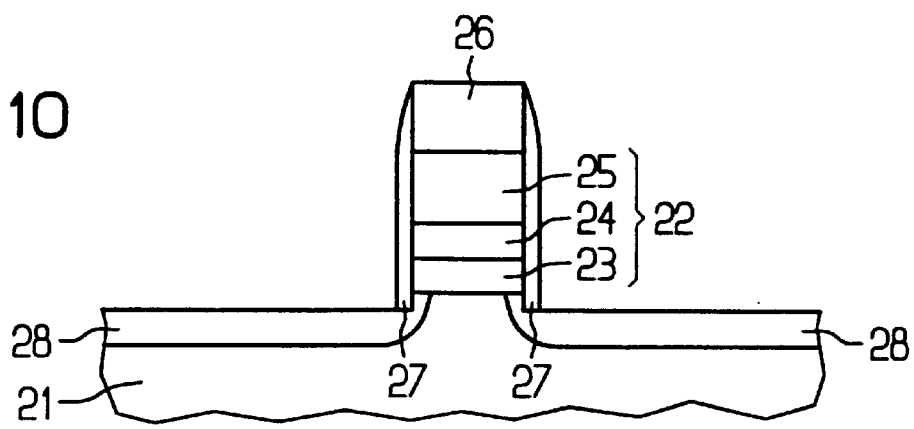
FIG. 10 is a cross-section through a semiconductor substrate with a mesa structure which has a first auxiliary layer as the uppermost layer and with a terminal region in the semiconductor substrate.

Referring to FIG. 1, a first silicon layer 2, a second silicon layer 3 and a third silicon layer 4 are applied to a substrate 1, for example a monocrystalline silicon wafer or the monocrystalline silicon layer of an SOI substrate. The first silicon layer 2, the second silicon layer 3 and the third silicon layer 4 are in this case respectively formed by in situ doped epitaxy using a process gas containing $Si_2H_2Cl_2$, $B_2H_6$, $AsH_3$, $PH_3$, HCl, $H_2$ in the temperature range of from 700° C. to 950° C. and in the pressure range of from 100 to 10,000 Pa. The first silicon layer 2 is formed to a thickness of 200 nm from n-doped silicon with a dopant concentration of $5\times10^{19}$ $cm^{-3}$. The second silicon layer 3 is formed to a thickness of 100 nm from p-doped silicon with a dopant concentration of $10^{18}$ $cm^{-3}$. The third silicon layer 4 is formed to a thickness of 100 nm from n-doped silicon with a dopant concentration of $5\times10^{19}$ $cm^{-3}$. Arsenic or phosphorus are used as the dopant for n-doped silicon, and boron is used as the dopant for p-doped silicon.

A first auxiliary layer 5 is applied to the third silicon layer 4. The first auxiliary layer 5 is formed from silicon nitride in a thickness of 200 nm.

Referring to FIG. 2, using photolithographic process steps, the first auxiliary layer 5, the third silicon layer 4, the second silicon layer 3 and the first silicon layer 2 are subsequently structured by anisotropic dry etching, for example with $CHF_3$, $O_2$ (for nitride) or HBr, $NF_3$, Heinonen, $O_2$ (for silicon). In this case, a mesa structure 6 is formed. During the structuring, use is made of lithography with a minimum lithographic dimension of F=0.6 µm and a maximum misalignment of 0.2 µm. The etching is continued about 100 nm into the substrate 1, so that the first silicon layer 2 is also removed outside the mesa structure 6. The mesa structure 6 has a cross-section of F×F parallel to the surface of the substrate 1.

During the formation of the mesa structure 6, a lower source/drain region 2' is formed from the first silicon layer 2, a channel region 3' is formed from the second silicon layer 3 and an upper source/drain region 4' is formed from the third silicon layer 4.

The side walls of the mesa structure 6 are subsequently provided with a 50 nm thick $SiO_2$ spacer 7. By implantation, for example with arsenic at a dose of $5\times10^{15}$ $cm^{-2}$, and an energy of 40 keV, a terminal region 8 which annularly surrounds the mesa structure is formed laterally with respect to the mesa structure 6 in the semiconductor substrate 1.

Referring to FIG. 3, after the $SiO_2$ spacers 7 have been removed, an insulating layer 9 of $SiO_2$ is applied surface-wide with essentially conformal edge coverage. The insulating layer 9 is formed in a thickness which corresponds to the height of the mesa structure 6, which comprises the lower source/drain region 2', the channel region 3' and the upper source/drain region 4'. The thickness of the insulating layer 9 is therefore, for example, 500 nm.

A second auxiliary layer 10 of $Si_3N_4$ is subsequently applied and structured selectively with respect to $SiO_2$. The second auxiliary layer 10 has essentially the same thickness as the first auxiliary layer 5, that is to say, for example, 200 nm. The second auxiliary layer 10 is structured in such a way that a surface of the insulating layer 9 is exposed in a first area 11, which laterally overlaps the mesa structure 6 and whose lateral dimensions are greater by at least twice the layer thickness of the insulating layer 9 than the corresponding lateral dimension of the mesa structure 6. The surface of the insulating layer 9 is furthermore exposed in a second area 12, which adjoins the first area 11 In the second area 12, island-like parts of the second auxiliary layer 10 remain during the structuring of the second auxiliary layer 10 (see FIG. 3 and the plan view of FIG. 3 which is represented in FIG. 4, the first area 11 and the second area 12 being respectively shown as a double arrow with the corresponding reference number). The section through FIG. 4 which is represented in FIG. 3 is denoted III—III in FIG. 4. The region where the topology of the insulating layer 9 has changed on account of the mesa structure 6 arranged underneath is indicated as a dashed line in FIG. 4. Furthermore, the cross-section of the mesa structure 6, which cannot be seen in the plan view, has been indicated as a dashed line.

Referring to FIG. 5, the insulating layer 9 is subsequently planarized by chemical/mechanical polishing. In this case, those parts of the insulating layer 9 which are arranged above the first auxiliary layer 5 are removed. The first auxiliary layer 5 and the second auxiliary layer 10 of silicon nitride act in this case as an etching stop. For this reason, the erosion of the insulating layer 9 stops as soon as the surface of the first auxiliary layer 5 or of the second auxiliary layer 10 is reached. Gaps remaining between the parts of the second auxiliary layer 10 and the insulating layer 9 are subsequently filled by conformal deposition and structuring of an $SiO_2$ layer with an insulating filling 13.

Referring to FIG. 6, using the first auxiliary layer S and the second auxiliary layer 10 as etching mask, the insulating layer 9 and the insulating filling 13 are subsequently etched. The etching is carried out, for example, with $C_4F_8$ selectively with respect to silicon nitride. In this case, the depth of the etching is determined through the etching time. The insulating layer 9 is etched to such an extent that the side walls of the upper source/drain region 4' and of the channel region 3' are exposed. Conversely, the side walls of the lower source/drain region 2' remain covered by the insulating layer 9. A gate dielectric 14 of, for example $SiO_2$, is then formed in a layer thickness of, for example, 5 nm by thermal oxidation on the exposed side walls of the channel region 3' and of the upper source/drain region 4'.

Referring to FIG. 7, in the opening resulting from the etching of the insulating layer 9, a gate electrode 15 is substantially formed by depositing a, for example, 400 nm thick n-doped polysilicon layer and subsequent planarizing with the aid of chemical/mechanical polishing and anisotropically etching back the polysilicon layer with HBr, $Cl_2$, Heinonen, $O_2$. The gate electrode 15 covers the entire bottom of the aforementioned opening. It has a height corresponding to the height of the channel region 3', for example 100 nm.

During the planarizing of the doped polysilicon layer, the first auxiliary layer 5 and the second auxiliary layer 10, each of which contain silicon nitride, again serve as a defined etching stop It is therefore possible to set the height of the gate electrode 15 accurately to a thickness corresponding to the channel length, for example 100 nm, by means of the duration of the anisotropic etching.

Insulating spacers 16, for example of $SiO_2$, are subsequently formed on the flanks of the opening in which the gate electrode 15 was formed. The insulating spacers 16 are formed by conformly depositing a 50 nm thick $SiO_2$ layer and subsequently etching back anisotropically selectively with respect to silicon and silicon nitride, for example with $CHF_3$, $O_2$.

Referring to FIG. 8, the gate electrode 15 is subsequently provided with a silicide terminal 17 by self-aligned siliciding. This is done, for example, by surface-wide application of a titanium layer which, in a subsequent heat-treatment step, forms the silicide terminal 17 with the underlying silicon of the gate electrode 15. In contrast, the titanium does not react with silicon nitride or silicon oxide, so that it can be subsequently removed selectively with respect to the silicide terminal 17.

The area above the silicide terminal 17 between the insulating spacers 16 is subsequently provided with an insulating filling 18, for example of $SiO_2$. The insulating filling 18 ends level with the first auxiliary layer 5 and the second auxiliary layer 10. In order to form the insulating filling 18, a further insulating layer is deposited surface-wide in a thickness of, for example, 300 nm. By planarizing by means of chemical/mechanical polishing, the insulating filling 18 is formed therefrom. The first auxiliary layer 5 and the second auxiliary layer 10 again act as an etching stop.

A third auxiliary layer 19, for example of polysilicon, is applied in a thickness of 100 nm and structured in such a way that the third auxiliary layer 19 covers the second auxiliary layer 10 in the second area 12 (see FIG. 4 and FIG. 8).

Referring to FIG. 9, the first auxiliary layer 5 and the second auxiliary layer 10, unless covered by the third auxiliary layer 19, are subsequently removed selectively with respect to $SiO_2$ and silicon, for example with hot $H_3PO_2$. In this case, the surface of the upper source/drain region 4' is exposed. In other words, a contact is opened to the upper source/drain region 4' with self-alignment.

After the third auxiliary layer 19 has been removed, photolithographic process steps are used to open contact holes to the terminal region 8 and to the silicide terminal 17 of the gate electrode 15. Contacts 20 are formed to the terminal region 8, the upper source/drain region 4' and the terminal region 17 of the gate electrode 15 by forming and structuring a metal layer, preferably of Al Si (1 percent) Cu (0.5 percent). During the opening of the contact hole to the silicide terminal 17 of the gate electrode 15, the part of the second auxiliary layer 10 remaining in the second area prevents the part of the insulating layer 9 arranged under the islands of the second auxiliary layer 10 from being etched through. Since this part of the insulating layer 9 has the same thickness as the insulating layer 9 in the area where the contact hole is formed to the terminal region 8, a short-circuit between the gate electrode 15 and the terminal region 8 is thereby avoided. The provision of islands in the region of the contact 20 to the gate electrode 15 makes it possible to have a fairly large contact hole, even if the dimensions of the mesa structure 6 (see, FIG. 6) and the islands are close to the minimum lithographic dimension F. The cross-section of the contact to the gate electrode 15 can therefore be optimized in terms of its electrical properties.

If the process is carried out so accurately that there is no risk of a short-circuit between the gate electrode 15 and the terminal region 8, the use of the third auxiliary layer 19, which protects the second auxiliary layer 10 at the contact to the gate electrode 15, may be obviated.

Referring to FIG. 10, in a further illustrative embodiment, a mesa structure 22, which comprises a lower source/drain region 23, a channel region 24 and an upper source/drain region 25 in vertical succession, is formed on a substrate 21, for example a monocrystalline silicon wafer or the monocrystalline silicon layer of an SOI substrate. The lower source/drain region 23 consists of n-doped silicon with a dopant concentration of $5 \times 10^{19}$ $cm^{-3}$ and a thickness of 100 nm. The channel region 24 consists of p-doped silicon with a dopant concentration of $10^{18}$ $cm^{-3}$ and a thickness of 100 nm. The upper source/drain region 25 consists of n-doped silicon with a dopant concentration of $5 \times 10^{19}$ $cm^{-3}$ and a thickness of 200 nm. Arsenic or phosphorous are used as the dopant for n-doped silicon, and boron is used as the dopant for p-doped silicon.

In order to form the mesa structure 22, a semiconductor layer sequence with an n-doped first silicon layer, a p-doped second silicon layer and an n-doped third silicon layer is grown by epitaxy with $Si_2H_2Cl_2$, $B_2H_6$, $AsH_3$, $PH_3$, HCl, $H_2$, as in the first illustrative embodiment. As an alternative, the semiconductor layer sequence may be formed by implantation and annealing. After application of an auxiliary layer 26, the layer sequence and the auxiliary layer 26 are structured by anisotropic etching to form the mesa structure 22. The mesa structure 22 is formed with an essentially square cross-section having a side length of 0.6 $\mu$m. The lithography which is used has in this case a minimum lithographic dimension of F=0.6 $\mu$m and a misalignment of at most 0.2 $\mu$m.

The anisotropic etching to form the mesa structure 22 is continued until the third silicon layer is also sure to have been penetrated during the formation of the lower source/drain region 23. The anisotropic etching is, for example, carried out with $CHF_3$, $O_2$ (for nitride) or HBr, $NF_3$, Heinonen, $O_2$ (for silicon).

The flanks of the mesa structure 22 are subsequently provided with $SiO_2$ spacers 27. The $SiO_2$ spacers 27 are, for example, formed by depositing an $SiO_2$ layer in a thickness of 50 nm and subsequently etching back anisotropically. In order to form a terminal region 28 for the lower source/drain region 23, implantation with arsenic at 40 keV and $5 \times 10^{15}$ $cm^{-2}$ is subsequently carried out. The dopant is activated by a heat-treatment at, for example, 1000° C. for 10 seconds.

Figure 11:
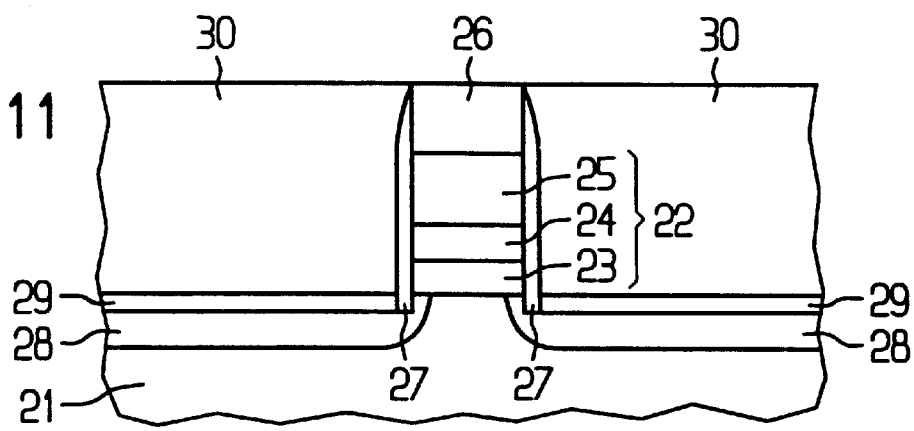
FIG. 11 is a cross-section through the semiconductor substrate after the formation of metal silicide layers on the surface of the terminal region and after the formation of an insulating layer which is deposited to a greater thickness than the mesa structure and the first auxiliary layer and which is subsequently planarized.

Referring to FIG. 11, a silicide terminal 29 is then formed on the surface of the terminal region 28 by self-aligned silicide formation. The silicide terminal 29 is, for example, formed from $TiSi_2$. It is used to reduce the series resistance of the terminal region 28 and the lower source/drain region 23. The terminal region 28 annularly surrounds the mesa structure 22.

An insulating layer 30, whose thickness is greater than the combined height of the mesa structure 22 and the auxiliary layer 26, is subsequently applied surface-wide. The insulating layer 30 has, for example, a thickness of 600 nm. The insulating layer 30 is planarized by chemical/mechanical polishing. In this case, the auxiliary layer 26 made of silicon nitride acts as an etching stop.

Figure 12:
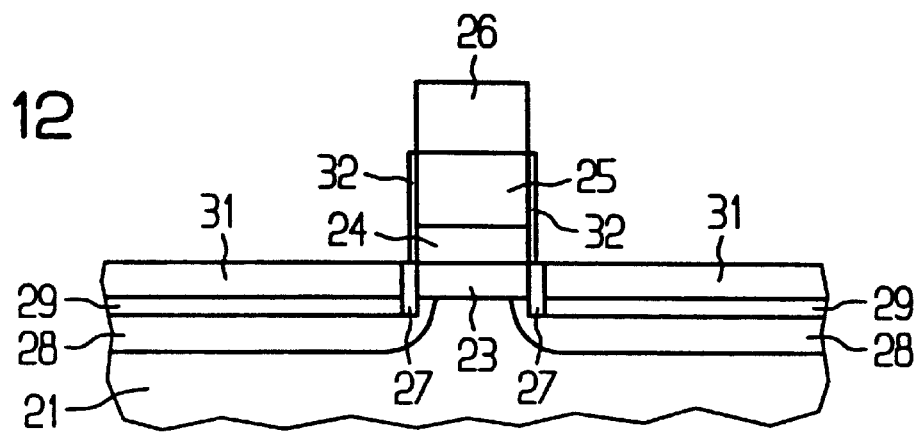
FIG. 12 is a cross-section through the semiconductor substrate after the insulating layer has been etched back and after the formation of a gate dielectric on the side walls of the mesa structure.

Referring to FIG. 12, the insulating layer 30 is etched, selectively with respect to nitride, to an extent which produces an insulation structure 31 ending level with the top of the lower source/drain region 23. This etching is, for example, carried out wet-chemically with $NHF_4$, HF. Since, after the planarizing, the insulating layer 30 ends level with the auxiliary layer 26 and has been planarized by chemical/mechanical polishing, the depth of the etching during the formation of the insulation structure 31 can be controlled accurately through the etching time In this case, the flanks of the channel region 24 and of the upper source/drain region 25 are exposed.

A gate dielectric 32, which has a thickness of, for example, 5 nm, is subsequently formed on the flanks of the channel region 24 and of the upper source/drain region 25 by thermal oxidation.

Figure 13:
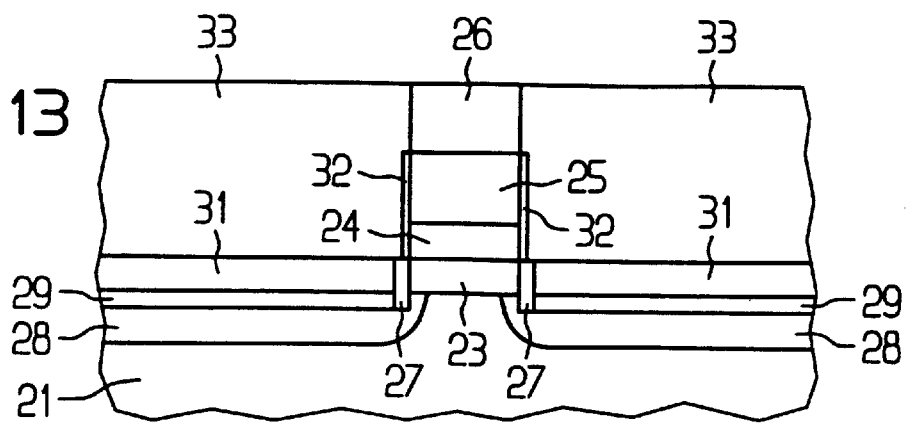
FIG. 13 is a cross-section through the semiconductor substrate after the formation of a further insulating layer whose thickness is greater than corresponds to the height of the exposed mesa structure, and planarizing of the further insulating layer.
Figure 14:
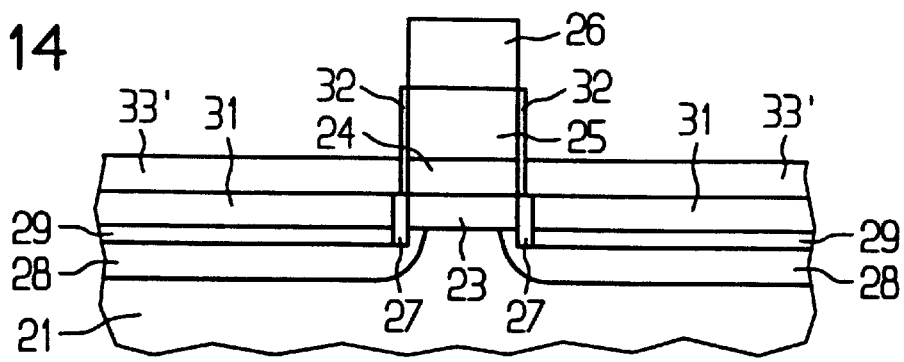
FIG. 14 is a cross-section through the semiconductor substrate after the insulating layer has been etched back.

Referring to FIG. 13, a doped polysilicon layer 33 is then produced. The doped polysilicon layer 33 has a thickness which corresponds at least to the sum of the thicknesses of the channel region 24, of the upper source/drain region 25 and of the auxiliary layer 26. This means that the doped polysilicon layer 33 has a thickness of, for example, 500 nm. The doped polysilicon layer 33 is planarized by chemical/mechanical polishing. In this case, the auxiliary layer 26 acts as an etching stop. The doped polysilicon layer 33 is etched back by etching with HBr, $Cl_2$, Heinonen, $O_2$, selectively with respect to silicon nitride and silicon oxide. In this case, a gate electrode layer 33' is formed whose height corresponds to the height of the channel region 24. This means that the gate electrode layer 33' has a height of 100 nm (see FIG. 14).

Figure 15:
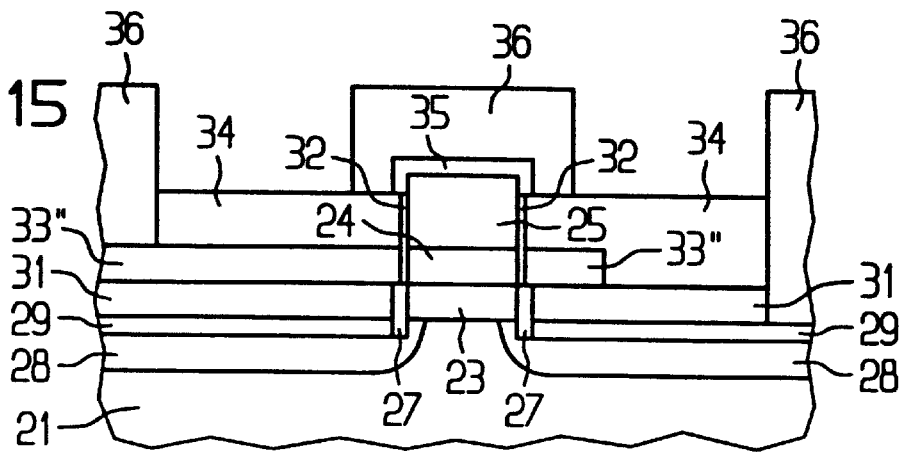
FIG. 15 is a cross-section through the semiconductor substrate after the first auxiliary layer has been removed, after the formation of a metal silicide layer on the exposed surface of the mesa structure and after the formation of contacts.

Referring to FIG. 15, using photolithographic process steps, the gate electrode layer 33' is structured, a laterally bounded gate electrode 33' being formed. According to the alignment of the photoresist mask used in this case, the gate electrode 33" then annularly surrounds the mesa structure 22 (FIG. 11) or is arranged only along some of the flanks of the mesa structure 22 (FIG. 11). By means of such overlap between the photoresist mask and the mesa structure 22, it is possible to reduce the width of the transistor to less than the minimum structure size F.

The gate electrode 33" is covered with a further insulation structure 34. To form the further insulation structure 34, a further insulation layer of, for example, $SiO_2$ is formed which projects over the mesa structure 22 (FIG. 11 )and the auxiliary layer 26. The further insulation structure 34 is formed by planarizing and etching back the further insulation layer. The auxiliary layer 26 is subsequently removed selectively with respect to $SiO_2$ and silicon, for example with hot $H_3PO_4$. In this case, the surface of the upper source/drain region 25 is exposed. The exposed surface of the upper source/drain region 25 is provided with a silicide terminal region 35 of, for example, $TiSi_2$. The silicide terminal region 35 is, for example, formed from titanium in a self-aligned siliciding process. In the further insulation structure 34, or in the further insulation structure 34 and the insulation structure 31, contact holes are opened to the silicide terminal 29 of the terminal region 28 and to the gate electrode 33", and are provided with contacts 36 A contact 36 is formed to the silicide terminal 35 of the upper source/drain region 25.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A method for the production of a vertical MOS transistor, said method comprising the steps of:
    forming a mesa structure by applying a semiconductor layer sequence of a lower source/drain region, a channel region, and an upper source/drain region to a main surface of a semiconductor substrate and structuring side walls of said mesa structure from said semiconductor layer sequence;
    applying a first auxiliary layer to said semiconductor layer sequence, said first auxiliary layer having sidewalls structured together with said semiconductor layer sequence;
    forming a terminal region for said lower source/drain region laterally with respect to said mesa structure and in said semiconductor substrate;
    forming an insulation structure covering at least said side walls of said lower source/drain region, said step of forming an insulation structure including the steps of:
        applying an insulating layer having a thickness at least equal to a thickness of said semiconductor layer sequence;
        planarizing said insulating layer by chemical/mechanical polishing up to a level of said first auxiliary layer, said first auxiliary layer acting as an etching stop; and
        further etching said insulating layer to expose said side walls of said channel region; and
    forming a gate dielectric and a gate electrode at said side walls of said channel region, said gate electrode having a height essentially equal to a height of said channel region.

2. The method according to claim 1, wherein said step of forming a terminal region further comprises the steps of:
    covering said side walls of said mesa structure with a masking spacer; and
    implanting said semiconductor substrate.

3. The method according to claim 1,
    wherein the step of applying an insulating layer comprises applying said insulating layer with essentially conformal edge coverage and with a thickness essentially equal to a thickness of said semiconductor layer sequence;
    said method further comprising the steps of:
        applying a second auxiliary layer to said insulating layer, said second auxiliary layer having a same etching properties and thickness as said first auxiliary layer;
        structuring said second auxiliary layer to expose said insulating layer at least in a first area laterally overlapping said mesa structure and having lateral dimensions greater by twice a thickness of said insulating layer than a corresponding lateral dimension of said mesa structure;
        exposing a surface of said first auxiliary layer by chemical/mechanical polishing said insulating layer;
        exposing said side walls of said channel region by etching said insulating layer, said first auxiliary layer and said second auxiliary layer being an etching mask;
        forming a gate dielectric on said side walls of said channel region;
        producing a conductive layer to essentially fill up an intermediate space between said insulating layer and said mesa structure; and forming a gate electrode by etching back said conductive layer.

4. The method according to claim 3, wherein the step of structuring of said second auxiliary layer comprises exposing said insulating layer in a second area adjoining said first area;

said method further comprising the steps of:

during the step of exposing of said side walls of said channel region, etching said insulating layer in said second area for producing a continuous opening in said first area and in said second area;

filling said continuous opening with said conductive layer;

after the step of forming said gate electrode, providing said first area and said second area with an insulating filling;

exposing a surface of said upper source/drain region by selectively removing said first auxiliary layer and said second auxiliary layer with respect to said insulating layer and with respect to said insulating filling; and opening a contact hole to said gate electrode in said second area.

5. The method according to claim 4, further comprising the steps of:

before the step of removing said first auxiliary layer and said second auxiliary layer, applying a third auxiliary layer, said first auxiliary layer and said second auxiliary layer being etched selectively with respect to said third auxiliary layer; and structuring said third auxiliary layer for exposing said first auxiliary layer and for covering said second area.

6. The method according to claim 5, wherein said first auxiliary layer and said second auxiliary layer comprise silicon nitride;

wherein said third auxiliary layer comprises polysilicon;

wherein said insulating layer and said insulating filling comprise silicon oxide; and wherein said conductive layer comprises doped polysilicon.

7. The method according to claim 5, further comprising the step of:

forming a layer of metal silicide on an upper surface of said terminal region.

8. The method according to claim 5, further comprising the step of:

forming a layer of metal silicide on an upper surface of said gate electrode.

9. The method according to claim 5, further comprising the step of:

forming a layer of metal silicide on an upper surface of said upper source/drain region.

10. The method according to claim 1, wherein the step of forming an insulation structure includes the steps of:

applying an insulating layer; and structuring said insulating layer by chemical/mechanical polishing and etching up to a level essentially equal to a height of said lower source/drain region and arranged laterally with respect to said mesa structure; and etching said insulating layer to expose said side walls of said channel region;

wherein said step of forming a gate dielectric and a gate electrode includes the steps of:

forming a gate dielectric at said side walls of said channel region; and forming a gate electrode by depositing and structuring a conductive layer; and wherein said method further comprises the steps of:

applying a further insulating layer covering said gate electrode; and forming contacts to said terminal region, said gate electrode, and said upper source/drain region.

11. The method according to claim 10, wherein said insulating layer, said further insulating layer, and said insulating filling can comprise silicon oxide;

wherein said first auxiliary layer comprises silicon nitride; and wherein said conductive layer comprises doped polysilicon.

12. The method according to claim 11, further comprising the step of:

forming a layer of metal silicide on an upper surface of said terminal region.

13. The method according to claim 11, further comprising the step of:

forming a layer of metal silicide on an upper surface of said gate electrode.

14. The method according to claim 11, further comprising the step of:

forming a layer of metal silicide on an upper surface of said upper source/drain region.

* * * * *